(12) United States Patent
Yoo

(10) Patent No.: US 11,034,579 B2
(45) Date of Patent: Jun. 15, 2021

(54) MICROPHONE AND MANUFACTURING METHOD THEREOF

(71) Applicants: Hyundai Motor Company, Seoul (KR); Kia Motors Corporation, Seoul (KR)

(72) Inventor: Il Seon Yoo, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/600,909

(22) Filed: Oct. 14, 2019

(65) Prior Publication Data

US 2021/0009407 A1 Jan. 14, 2021

(30) Foreign Application Priority Data

Jul. 12, 2019 (KR) .......................... 10-2019-0084673

(51) Int. Cl.
*H04R 19/04* (2006.01)
*B81B 7/00* (2006.01)
*B81B 7/02* (2006.01)

(52) U.S. Cl.
CPC .......... *B81B 7/0061* (2013.01); *B81B 7/0077* (2013.01); *B81B 7/02* (2013.01); *H04R 19/04* (2013.01); *H04R 2201/003* (2013.01)

(58) Field of Classification Search
CPC ...... H04R 19/04; H04R 2201/003; B81B 7/00
See application file for complete search history.

(56) References Cited

U.S. PATENT DOCUMENTS

| 2017/0041692 | A1* | 2/2017 | Watson | H04R 19/04 |
| 2017/0094405 | A1* | 3/2017 | Yoo | H04R 1/326 |
| 2018/0070162 | A1* | 3/2018 | Lim | H01L 23/04 |

OTHER PUBLICATIONS

Zinserling, "Silicon-based MEMS Microphone for Automotive Applications", MicroNano News, Feb. 2007, pp. 8-11.

* cited by examiner

*Primary Examiner* — Sunita Joshi
(74) *Attorney, Agent, or Firm* — Mintz Levin Cohn Ferris Glovsky and Popeo, P.C.; Peter F. Corless

(57) ABSTRACT

A microphone includes a substrate having a first sound hole formed therein, a sound-sensing module mounted on the substrate so as to be aligned with the first sound hole, a signal-processing chip mounted on the substrate so as to be electrically connected to the sound-sensing module, a cover mounted on the substrate so as to accommodate the sound-sensing module therein and including a filter accommodation portion having a second sound hole formed therein, and a sound delay filter elastically accommodated in the filter accommodation portion so as to be aligned with the second sound hole. The microphone has a simplified structure, and can be manufactured to as to improve the stability and reliability thereof.

15 Claims, 17 Drawing Sheets

MICROPHONE AND MANUFACTURING METHOD THEREOF

CROSS-REFERENCE TO RELATED APPLICATION

This application claims under 35 U.S.C. § 119(a) the benefit of Korean Patent Application No. 10-2019-0084673, filed on Jul. 12, 2019 in the Korean Intellectual Property Office, the entire contents of which are incorporated herein by reference.

BACKGROUND

1. Technical Field

The present disclosure relates to a microphone and a manufacturing method thereof, more particularly, to the microphone and manufacturing method for simplifying the structure thereof and improving the stability and reliability thereof.

2. Description of the Related Art

A microphone is an apparatus that converts sound into an electrical signal. In recent years, a microphone using micro-electro-mechanical-system (MEMS) technology (hereinafter referred to as a "MEMS microphone") has been developed.

A MEMS microphone has high resistance to humidity and heat and is capable of being miniaturized compared to an electret condenser microphone (ECM). For example, a MEMS microphone may be applied to various communication devices including earphones, hearing aids, and mobile communication devices such as smart phones, or may be used as a microphone in a vehicle.

A MEMS microphone typically includes a substrate, which has a first sound hole formed therein; a sound-sensing module, which is mounted on the substrate so as to be aligned with the first sound hole; a signal-processing chip (an integrated circuit), which is electrically connected to the sound-sensing module (e.g., in a wire-bonding manner) and receives a signal; a cover, which has a second sound hole formed therein and is mounted on the substrate so as to be accommodated in the sound-sensing module; and a sound delay filter, which is mounted to the cover so as to be aligned with the second sound hole and delays the sound passing through the second sound hole.

If the sound delay filter is mounted so as to protrude from the outer surface of the cover, the sound delay filter may be easily damaged and separated by external impact and interference. Therefore, the sound delay filter needs to be mounted inside the cover.

However, in the related art, the sound delay filter is mounted on the inner surface of the cover using an adhesive, which makes a manufacturing process complicated and inconvenient. In addition, in the process of bonding the sound delay filter, a filter hole formed in the sound delay filter is blocked by the adhesive, which may lead to deterioration in the performance of the sound delay filter and an increase in a product failure rate.

A MEMS microphone is mounted on the substrate through surface mount technology (SMT). However, the sound delay filter is damaged and deformed by high-temperature heat (e.g., 200° C.) that is generated in the process of mounting the MEMS microphone (e.g., the process of soldering the cover).

Therefore, in recent years, research has focused on simplifying the structure of a MEMS microphone and the process of manufacturing the same and to improve the stability and reliability thereof, but results thereof are insufficient, and thus there is a need for further development.

SUMMARY

It is an object of the present disclosure to provide a microphone and a manufacturing method for simplifying the structure thereof and improving the stability and reliability thereof.

It is another object of the present disclosure to enable mounting of a sound delay filter without using an adhesive, thereby preventing performance deterioration and defects attributable to the use of adhesive.

It is a further object of the present disclosure to simplify the process of manufacturing a microphone, to reduce the manufacturing costs thereof, and to improve productivity.

It is still another object of the present disclosure to improve the durability of a sound delay filter and to increase production yield.

In accordance with an aspect of the present disclosure, the above and other objects can be accomplished by the provision of a microphone including a substrate having a first sound hole formed therein, a sound-sensing module mounted on the substrate, the sound-sensing module being aligned with the first sound hole, a signal-processing chip mounted on the substrate, the signal-processing chip being electrically connected to the sound-sensing module, a cover mounted on the substrate, the cover accommodating the sound-sensing module therein, the cover including a filter accommodation portion having a second sound hole formed therein, and a sound delay filter elastically accommodated in the filter accommodation portion, the sound delay filter being aligned with the second sound hole.

Thus, it is possible to simplify the structure of the microphone and to improve the stability and reliability thereof.

In the related art, a sound delay filter is mounted on a cover using an adhesive, which makes a manufacturing process complicated and inconvenient. In addition, in the process of bonding the sound delay filter, a filter hole formed in the sound delay filter may be blocked by the adhesive, which may lead to deterioration in the performance of the sound delay filter and an increase in a product failure rate.

However, according to the present disclosure, the sound delay filter may be elastically mounted in the filter accommodation portion provided at the cover. Thus, a bonding process using an adhesive may be omitted, thereby simplifying the structure of the microphone and the process of manufacturing the same and preventing deterioration in the performance of the sound delay filter and defects attributable to the use of adhesive.

The sound delay filter may include a filter substrate having a filter hole formed therein, and an elastic pattern integrally formed with at least one end portion of the filter substrate, the elastic pattern being elastically disposed between the inner wall of the filter accommodation portion and the filter substrate. The sound delay filter may be formed of a polymer material.

The elastic pattern may include a contact pattern spaced apart from the end portion of the filter substrate, the contact pattern being in contact with the inner wall of the filter accommodation portion, and a spring pattern elastically connecting the filter substrate to the contact pattern.

The elastic pattern may be provided symmetrically in a pair at opposite side end portions of the filter substrate in the direction in which the sound delay filter enters the filter accommodation portion.

The spring pattern may be formed in any of various structures capable of being elastically compressed and restored between the contact pattern and the filter substrate. In one example, the spring pattern may be formed in a closed loop shape between the filter substrate and the contact pattern. In another example, the spring pattern may be formed in an open loop shape between the filter substrate and the contact pattern.

The filter accommodation portion may include an entry guide configured to guide the entry of the sound delay filter thereinto. In one example, the entry guide may include an inclined guide surface formed at one end of the filter accommodation portion to guide the entry of the sound delay filter into the filter accommodation portion.

In the state in which the sound delay filter is accommodated in the filter accommodation portion, the upper surface of the sound delay filter may not protrude to the outside of the cover, but may be disposed inside the cover.

As such, since the sound delay filter does not protrude to the outside of the cover but is disposed inside the cover, it is possible to minimize the exposure of the sound delay filter to external impacts and interference. In addition, it is possible to minimize damage to the sound delay filter and separation thereof attributable to external impacts and interference.

The filter accommodation portion may include a latching protrusion configured to restrict the movement of the outer surface of the sound delay filter.

As such, since the movement of the outer surface of the sound delay filter that is exposed to the outside is restricted by the latching protrusion in the state in which the sound delay filter is accommodated in the filter accommodation portion, it is possible to more securely support the arrangement of the sound delay filter.

In accordance with another aspect of the present disclosure, there is provided a method of manufacturing a microphone, the method including mounting a sound-sensing module on a substrate, in which a first sound hole is formed, so as to be aligned with the first sound hole, mounting a signal-processing chip on the substrate so as to be electrically connected to the sound-sensing module, mounting a cover including a filter accommodation portion having a second sound hole formed therein on the substrate, and elastically disposing a sound delay filter in the filter accommodation portion so as to be aligned with the second sound hole.

The filter accommodation portion may be formed so as to be recessed in the outer surface of the cover, and the sound delay filter may be disposed inside the cover.

In one example, the sound delay filter may include a filter substrate having a filter hole formed therein, and an elastic pattern integrally formed with at least one end portion of the filter substrate, the elastic pattern being elastically disposed between the inner wall of the filter accommodation portion and the filter substrate.

The elastic pattern may include a contact pattern spaced apart from the end portion of the filter substrate, the contact pattern being in contact with the inner wall of the filter accommodation portion, and a spring pattern elastically connecting the filter substrate to the contact pattern.

The sound delay filter may be disposed in the filter accommodation portion after the cover is soldered to the substrate.

As such, since the sound delay filter is mounted after the cover is soldered to the substrate, it is possible to prevent damage to the sound delay filter and deformation thereof attributable to high-temperature heat generated during the process of soldering the cover to the substrate.

In particular, according to the present disclosure, since the sound delay filter is mounted in the cover in a non-bonding manner without using an adhesive, the sound delay filter may be mounted in the cover after the cover is soldered to the substrate. Thus, it is possible to minimize the exposure of the sound delay filter to external impacts and interference and to prevent damage to the sound delay filter and deformation thereof attributable to high-temperature heat generated during the process of soldering the cover to the substrate.

The sound delay filter may be manufactured in any of various ways depending on the required conditions and design specifications. In one example, the sound delay filter may be manufactured by forming a sacrificial layer on the upper surface of a base substrate, forming a polymer layer on the upper surface of the sacrificial layer, patterning the polymer layer to form the filter substrate and the elastic pattern, and removing the sacrificial layer from the filter substrate and the elastic pattern.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
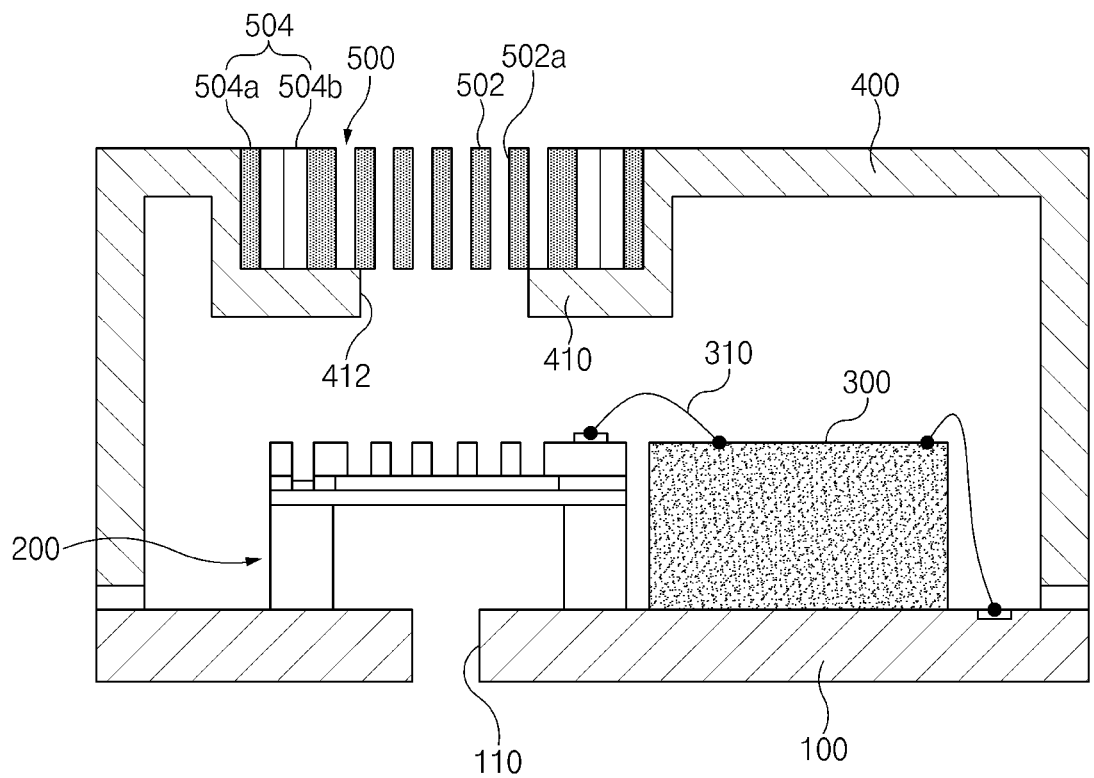
FIG. 1 is a view illustrating a microphone according to an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Advantages and features of the present disclosure and methods for achieving them will become apparent from the descriptions of aspects herein below with reference to the accompanying drawings. However, the present disclosure is not limited to the aspects disclosed herein, but may be implemented in various different forms. The aspects are provided to make the description of the present disclosure thorough and to fully convey the scope of the present disclosure to those skilled in the art. It is to be noted that the scope of the present disclosure is defined only by the claims. Like reference numerals designate like elements throughout the specification. In relation to describing the present disclosure, when a detailed description of relevant known technology is determined to unnecessarily obscure the gist of the present disclosure, the detailed description may be omitted.

Figure 2:
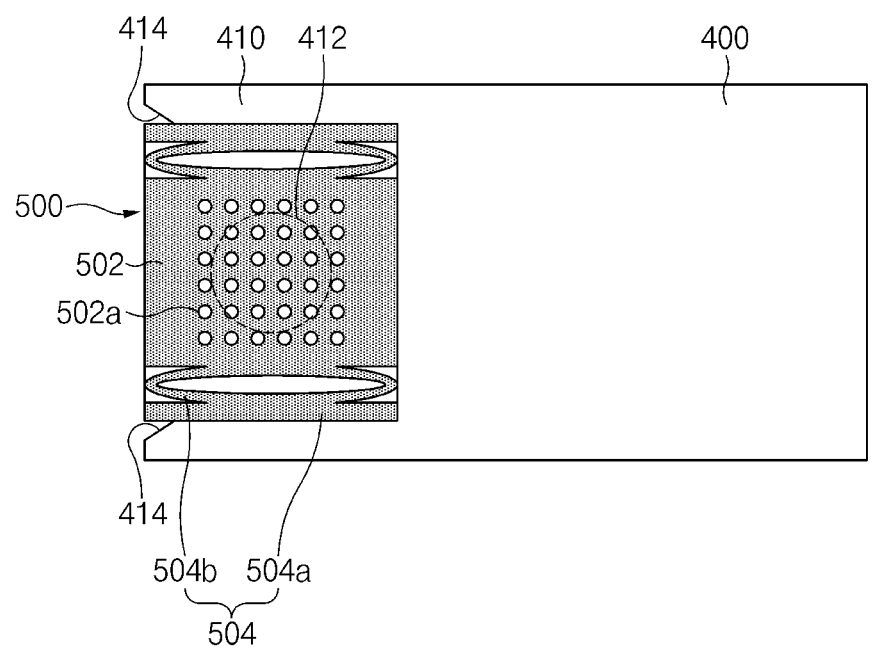
FIG. 2 is a view illustrating a sound delay filter of the microphone according to the embodiment of the present disclosure.
Figure 3:
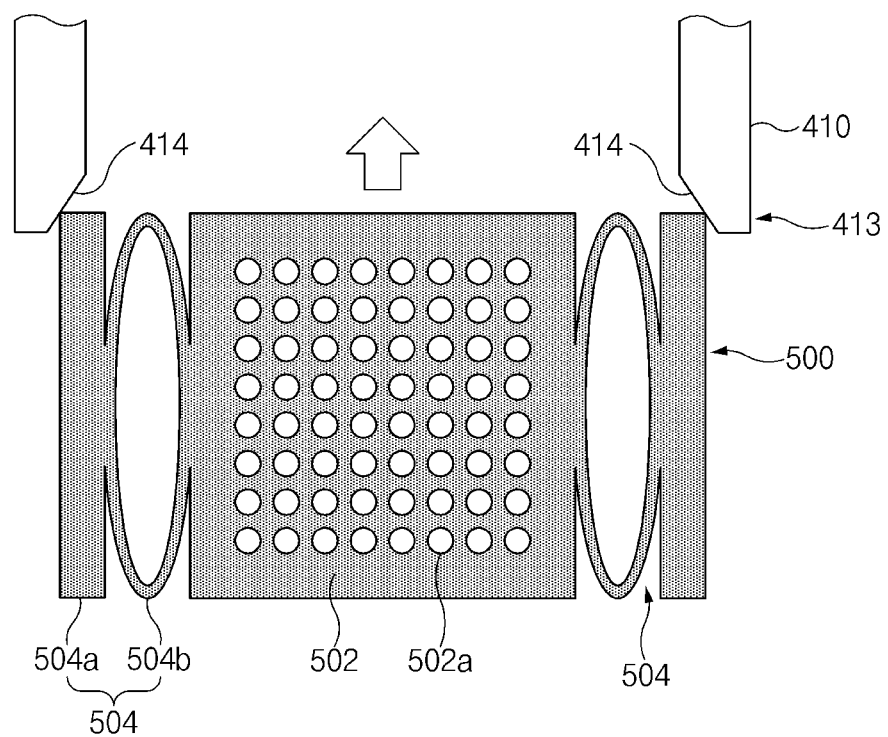
FIGS. 3 to 5 are views illustrating a process of mounting the sound delay filter using an entry guide in the microphone according to the embodiment of the present disclosure.
Figure 4:
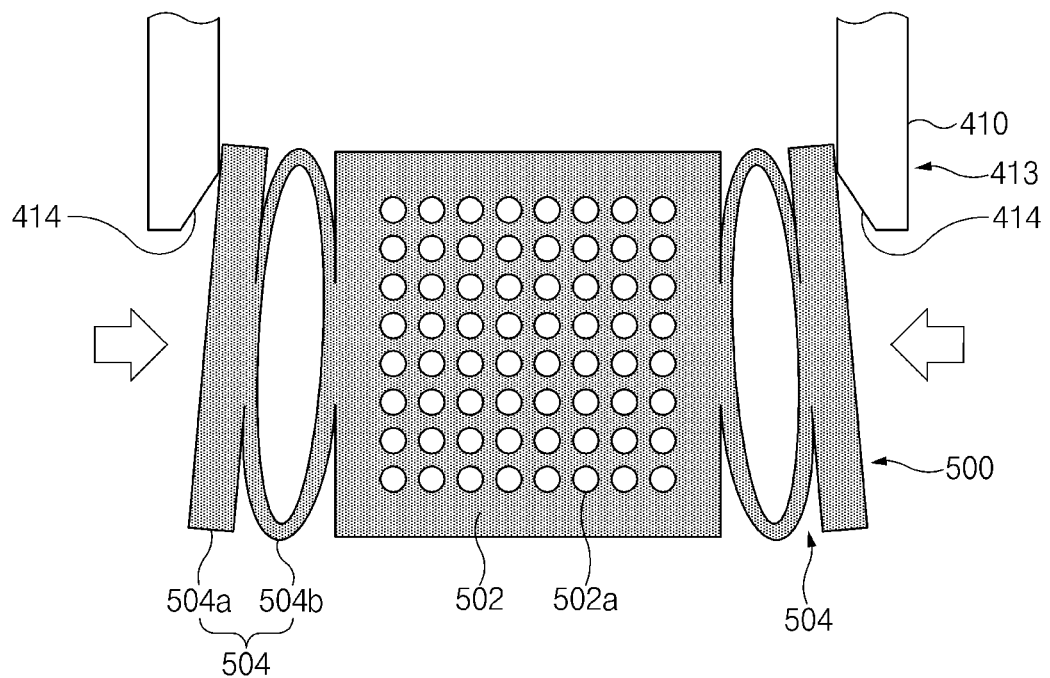
Figure 5:
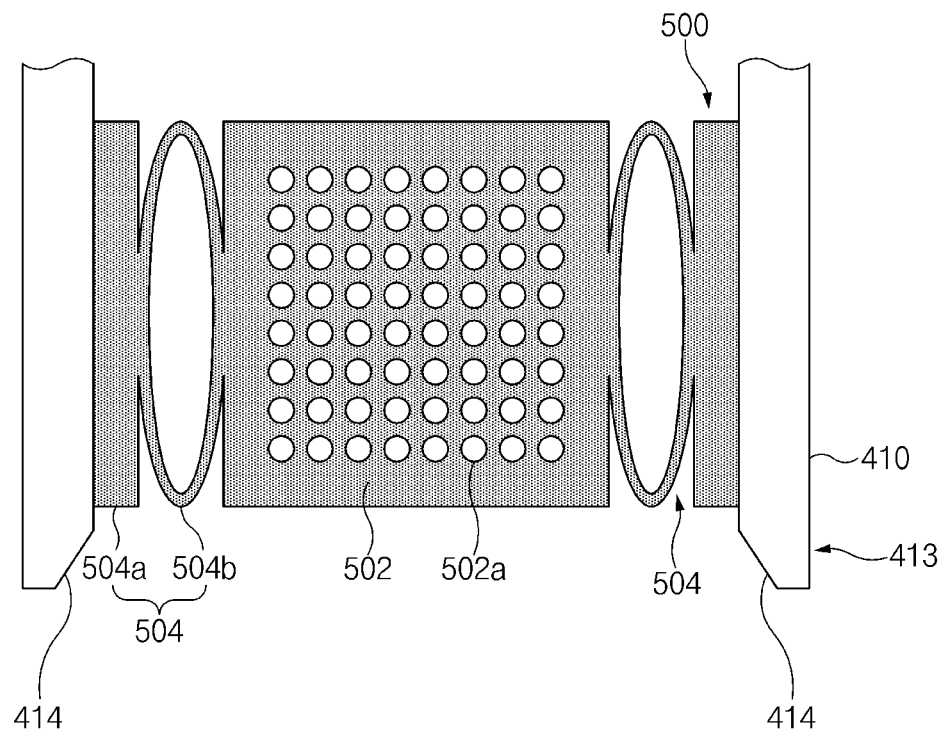
Figure 6:
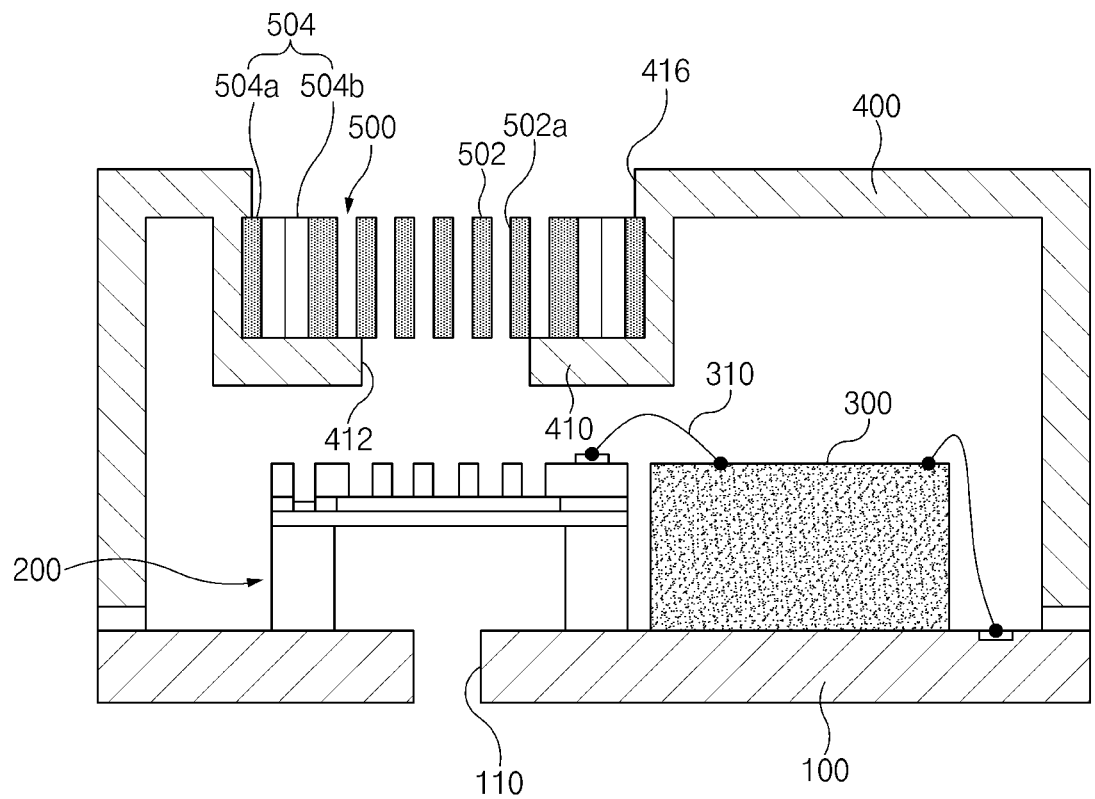
FIG. 6 is a view illustrating latching protrusions of the microphone according to the embodiment of the present disclosure.
Figure 7:
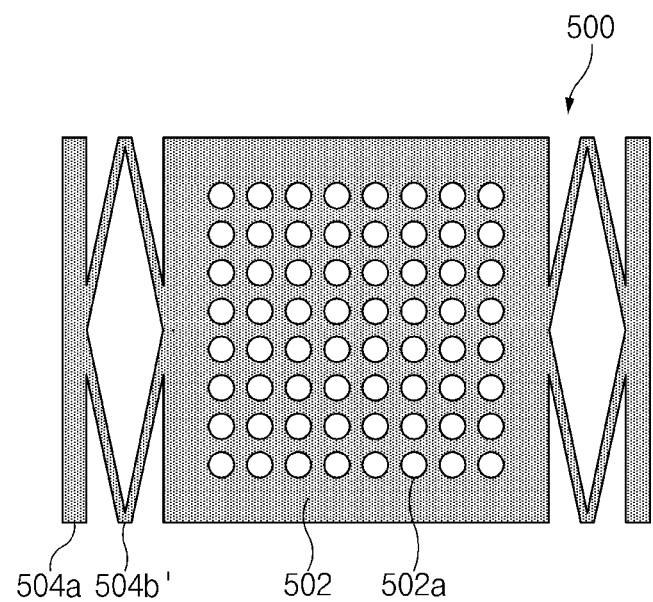
FIGS. 7 to 9 are views illustrating modified examples of the sound delay filter of the microphone according to the embodiment of the present disclosure.
Figure 8:
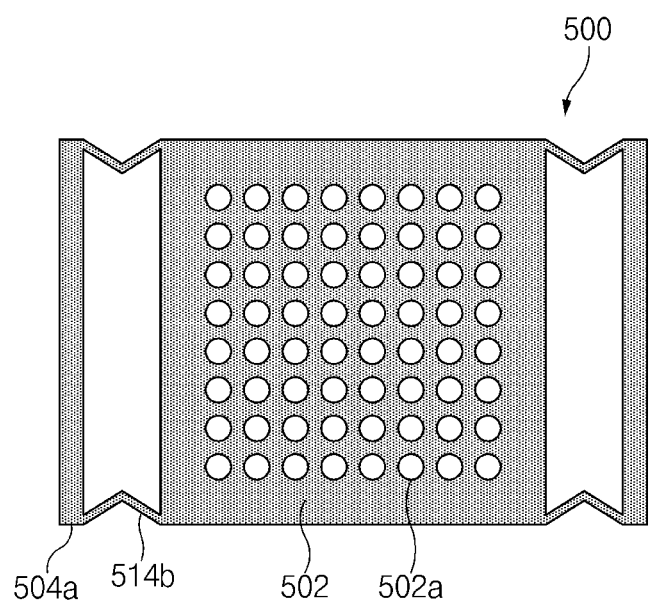
Figure 9:
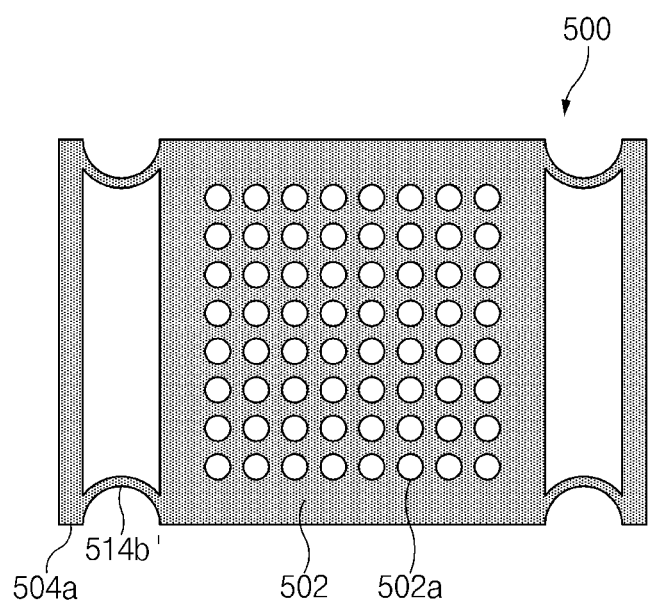

FIG. 1 is a view illustrating a microphone according to an embodiment of the present disclosure, and FIG. 2 is a view illustrating a sound delay filter of the microphone according to the embodiment of the present disclosure. FIGS. 3 to 5 are views illustrating a process of mounting the sound delay filter using an entry guide in the microphone according to the embodiment of the present disclosure, and FIG. 6 is a view illustrating latching protrusions of the microphone according to the embodiment of the present disclosure. FIGS. 7 to 9 are views illustrating modified examples of the sound delay filter of the microphone according to the embodiment of the present disclosure.

Referring to FIGS. 1 to 9, a microphone 10 according to the present disclosure includes a substrate 100, which has a first sound hole 110 formed therein; a sound-sensing module 200, which is mounted on the substrate 100 so as to be aligned with the first sound hole 110; a signal-processing chip 300, which is mounted on the substrate 100 so as to be electrically connected to the sound-sensing module 200; a cover 400, which is mounted on the substrate 100 so as to accommodate the sound-sensing module 200 therein and includes a filter accommodation portion 410 having a second sound hole 412 formed therein; and a sound delay filter 500, which is elastically accommodated in the filter accommodation portion 410 so as to be aligned with the second sound hole 412.

The microphone 10 according to the present disclosure may be manufactured using micro-electro-mechanical-system (MEMS) technology, and may be applied to various communication devices including earphones, hearing aids, and mobile communication devices such as smart phones, or may be used as a microphone in a vehicle. However, the present disclosure is not restricted or limited as to any specific use of the microphone 10.

The first sound hole 110 is formed through the substrate 100. In one example, a printed circuit board (PCB) may be used as the substrate 100.

In particular, the first sound hole 110 is a passage through which sound generated from a sound source, which is present outside the substrate 100, is introduced into the substrate 100.

The sound-sensing module 200 is mounted on the substrate 100 so as to be aligned with the first sound hole 110.

In particular, the structure in which the sound-sensing module 200 is mounted on one surface of the substrate 100 (the upper surface of the substrate in FIG. 1) so as to be aligned with the first sound hole 110 refers to the sound-sensing module 200 being mounted at a location that is aligned with the first sound hole 110 so that the sound introduced into the first sound hole 110 from an external sound source is input to the sound-sensing module 200.

The sound-sensing module 200 may be formed in any of various structures capable of sensing sound. The present disclosure is not restricted or limited to any specific structure of the sound-sensing module 200.

In one example, the sound-sensing module 200 includes an acoustic substrate (not shown) in which a sound hole is formed, a vibration membrane (not shown) provided on the acoustic substrate, and a fixing membrane (not shown) provided on the vibration membrane. The sound-sensing module 200 may be implemented as a capacitive MEMS device based on MEMS technology.

Specifically, when sound is transferred to the vibration membrane from the outside, a capacitance value may change as the interval between the fixing membrane and the vibration membrane changes, and the sound pressure may be measured through the electrical signal generated at this time.

The signal-processing chip 300 is mounted on the substrate 100 so as to be electrically connected to the sound-sensing module 200.

The signal-processing chip 300 and the sound-sensing module 200 may be electrically connected to each other via a wire. The signal-processing chip 300 receives a sound output signal output from the sound-sensing module 200 and transmits the same to the outside.

An application specific integrated circuit (ASIC) may be used as the signal-processing chip 300.

The mounting position of the signal-processing chip 300 may be variously changed depending on the required conditions and design specifications. In one example, referring to FIG. 1, the signal-processing chip 300 may be mounted on the upper surface of the substrate 100 so as to be disposed on the right of the sound-sensing module 200. According to another embodiment of the present disclosure, the signal-processing chip may be mounted on the outer surface of the substrate (the bottom surface of the substrate in FIG. 1).

The cover 400 is formed of a metal material and is mounted on the substrate 100 so as to accommodate the sound-sensing module 200 therein. A predetermined internal space is formed between the substrate 100 and the cover 400.

The shape and structure of the cover 400 may be variously changed depending on the required conditions and design specifications. In one example, the cover 400 may be formed in a rectangular box shape that has an accommodation space therein.

The cover 400 is integrally provided with the filter accommodation portion 410 having the second sound hole 412 formed therein.

In particular, the filter accommodation portion 410 may be understood to be a structure integrally formed with the cover 400 so that the sound delay filter 500 is mounted therein.

The second sound hole 412 is a passage through which sound generated from a sound source, which is present outside the cover 400, is introduced into the cover 400.

The filter accommodation portion 410 may be formed at any of various locations depending on the required conditions and design specifications. In one example, referring to FIG. 1, the filter accommodation portion 410 is formed so as to be recessed in the upper surface of the cover 400, and the second sound hole 412 is formed through the bottom surface of the filter accommodation portion 410 so as to be aligned with the first sound hole 110. According to another embodiment of the present disclosure, the filter accommodation portion may be formed on the side surface of the cover or at any of various other locations on the cover.

Like the above-described first sound hole 110, the sound introduced into the cover 400 through the second sound hole 412 is sensed by the sound-sensing module 200.

The sound delay filter 500 is elastically accommodated in the filter accommodation portion 410 so as to be aligned with the second sound hole 412.

Specifically, the sound delay filter 500 is mounted in the filter accommodation portion 410 so as to be aligned with the second sound hole 412. The sound delay filter 500 serves to delay the sound passing through the second sound hole 412.

The sound delay filter 500 may be formed in any of various structures capable of being elastically accommodated in the filter accommodation portion 410.

In one example, the sound delay filter 500 includes a filter substrate 502 having a filter hole 502a formed therein, and an elastic pattern 504, which is integrally formed with at least one end portion of the filter substrate 502 and is elastically disposed between the inner wall of the filter accommodation portion 410 and the filter substrate 502.

The sound delay filter 500 may be formed of a polymer material. As such, since the sound delay filter 500 is formed of a polymer material, which is manufactured at a lower cost than a silicon material, it is possible to reduce the manufacturing costs of the sound delay filter 500.

The filter substrate 502 is aligned with the second sound hole 412, and the filter hole 502a is provided in a plural number and is formed through the filter substrate 502.

The diameter of the filter holes 502a and the arrangement interval therebetween may be variously changed depending on the required conditions and use environment. The present disclosure is not restricted or limited as to the diameter of the filter holes 502a or the arrangement interval therebetween. In one example, the diameter of the filter holes 502a and the arrangement interval therebetween may be determined according to the frequency of the sound introduced into the microphone 10.

The elastic pattern 504 is integrally formed with the end portion of the filter substrate 502, and is disposed between the inner wall of the filter accommodation portion 410 and the filter substrate 502 so as to be elastically compressed.

The elastic pattern 504 may be provided symmetrically in a pair at opposite side end portions of the filter substrate 502 in the direction in which the sound delay filter 500 enters the filter accommodation portion 410.

Specifically, each of the elastic patterns 504 includes a contact pattern 504a, which is spaced apart from a corresponding one of the end portions of the filter substrate 502 and is in contact with the inner wall of the filter accommodation portion 410, and a spring pattern 504b, which elastically connects the filter substrate 502 to the contact pattern 504a.

The contact pattern 504a may be formed in any of various shapes capable of contacting the inner wall of the filter accommodation portion 410. In one example, the contact pattern 504a may be formed in the shape of a straight bar that is in continuous contact with the inner wall of the filter accommodation portion 410.

The spring pattern 504b integrally connects the contact pattern 504a and the filter substrate 502 to each other. The spring pattern 504b is configured to be elastically compressed and restored between the contact pattern 504a and the filter substrate 502.

The spring pattern 504b may be formed in any of various structures capable of being elastically compressed and restored between the contact pattern 504a and the filter substrate 502. The present disclosure is not restricted or limited as to the structure or shape of the spring pattern 504b.

In one example, the spring pattern 504b may be formed in a closed loop shape between the filter substrate 502 and the contact pattern 504a.

Specifically, referring to FIG. 2, the spring pattern 504b may be formed in an elliptical shape having a closed loop structure. According to another embodiment of the present disclosure, as shown in FIG. 7, a spring pattern 504b' may be formed in a diamond shape having a closed loop structure, or may be formed in a polygonal shape having any of various other closed loop structures.

In still another example, a spring pattern 514b and 514b' may be formed in an open loop shape between the filter substrate 502 and the contact pattern 504a.

Specifically, referring to FIG. 8, the spring pattern 514b may be formed in a bent 'V' shape having an open loop structure. Alternatively, as shown in FIG. 9, the spring pattern 514b' may be formed in an arc shape having an open loop structure.

Referring to FIGS. 3 to 5, the filter accommodation portion 410 may be provided with an entry guide 413 configured to guide the entry of the sound delay filter 500 thereinto.

The entry guide 413 may be formed in any of various structures capable of guiding the entry of the sound delay filter 500 into the filter accommodation portion 410.

In one example, the entry guide 413 includes inclined guide surfaces 414 formed at one end of the filter accommodation portion 410 in order to guide the entry of the sound delay filter 500 into the filter accommodation portion 410. The inclined guide surfaces 414 are provided to form an entrance (an entrance to the filter accommodation portion), which is gradually reduced in width in a direction from the outside of the filter accommodation portion 410 to the inside thereof.

Specifically, the sound delay filter 500 may enter the filter accommodation portion 410 in a horizontal direction from the side surface of the filter accommodation portion 410 along the inclined guide surfaces 414.

Referring to FIG. 3, in the state in which the contact patterns 504a formed at the opposite side end portions of the sound delay filter 500 are in contact with the inclined guide surfaces 414, the sound delay filter 500 is pushed into the filter accommodation portion 410. Thereafter, as shown in FIG. 4, the contact patterns 504a move along the inclined guide surfaces 414, and at the same time the spring patterns 504b are elastically compressed. In this manner, the sound delay filter 500 enters the filter accommodation portion 410.

After the sound delay filter 500 completely enters the filter accommodation portion 410, as shown in FIG. 5, the arrangement of the sound delay filter 500 (the state of being accommodated in the filter accommodation portion) may be elastically supported by the elastic force of the spring patterns 504b elastically compressed between the contact patterns 504a and the filter substrate 502.

Although it is described and illustrated by way of example in the embodiment of the present disclosure that the sound delay filter 500 enters the filter accommodation portion 410 in a horizontal direction from the side surface of the filter accommodation portion 410, the present disclosure is not limited thereto. According to another embodiment of the present disclosure, the sound delay filter may enter the filter accommodation portion from the upper side of the filter accommodation portion.

As described above, according to the present disclosure, the sound delay filter 500 is elastically mounted in the filter accommodation portion 410 provided at the cover 400. Thus, a bonding process using an adhesive may be omitted, thereby simplifying the structure of the microphone and the process of manufacturing the same and preventing deterioration in the performance of the sound delay filter 500 and defects attributable to the use of adhesive.

In the related art, an adhesive is applied to the sound delay filter 500 through a separate adhesive application process, and the sound delay filter 500 is secured to the inner surface of the cover 400 using the adhesive, which makes the manufacturing process complicated and inconvenient. In addition, the filter holes 502a formed in the sound delay filter 500 are blocked by the adhesive, which leads to deterioration in the performance of the sound delay filter 500 and an increase in a product failure rate.

However, according to the present disclosure, the arrangement of the sound delay filter 500 is securely supported by the elastic force of the spring patterns 504b in a non-bonding manner without using an adhesive, thereby preventing blocking of the filter holes 502a by an adhesive and performance deterioration thereof and simplifying the structure of the microphone and the process of manufacturing the same.

In the state in which the sound delay filter 500 is accommodated in the filter accommodation portion 410, the upper surface of the sound delay filter 500 may not protrude to the outside of the cover 400, but may be disposed inside the cover 400.

Alternatively, in the state in which the sound delay filter 500 is accommodated in the filter accommodation portion 410, the upper surface of the sound delay filter 500 may be in the same plane as the upper surface of the cover 400.

As such, since the sound delay filter 500 does not protrude to the outside of the cover 400 but is disposed inside the cover 400, it is possible to minimize the exposure of the sound delay filter 500 to external impacts and interference. In addition, it is possible to minimize damage to the sound delay filter 500 and separation thereof attributable to external impacts and interference.

Referring to FIG. 6, according to another embodiment of the present disclosure, latching protrusions 416 may be formed at the filter accommodation portion 410. In the state in which the sound delay filter 500 is accommodated in the filter accommodation portion 410, the movement of the outer surface (the upper surface in FIG. 6) of the sound delay filter 500, which is exposed to the outside, may be restricted by the latching protrusions 416.

As such, since the movement of the outer surface of the sound delay filter 500, which is exposed to the outside, is restricted by the latching protrusions 416 in the state in which the sound delay filter 500 is accommodated in the filter accommodation portion 410, it is possible to more securely support the arrangement of the sound delay filter 500.

FIGS. 10 to 13 are views illustrating a method of manufacturing the microphone 10 according to an embodiment of the present disclosure, and FIGS. 14 to 17 are views illustrating a process of manufacturing the sound delay filter 500 in the method of manufacturing the microphone 10 according to the embodiment of the present disclosure. Parts that are the same as, or extremely similar to, those of the above description are denoted by the same reference numerals, and a detailed description thereof will be omitted.

Referring to FIGS. 10 to 13, a method of manufacturing the microphone 10 according to an embodiment of the present disclosure includes a step of mounting a sound-sensing module 200 on a substrate 100, in which a first sound hole 110 is formed, so as to be aligned with the first sound hole 110, a step of mounting a signal-processing chip 300 on the substrate 100 so as to be electrically connected to the sound-sensing module 200, a step of mounting a cover 400, which includes a filter accommodation portion 410 having a second sound hole 412 formed therein, on the substrate 100, and a step of elastically disposing a sound delay filter 500 in the filter accommodation portion 410 so as to be aligned with the second sound hole 412.

Figure 10:
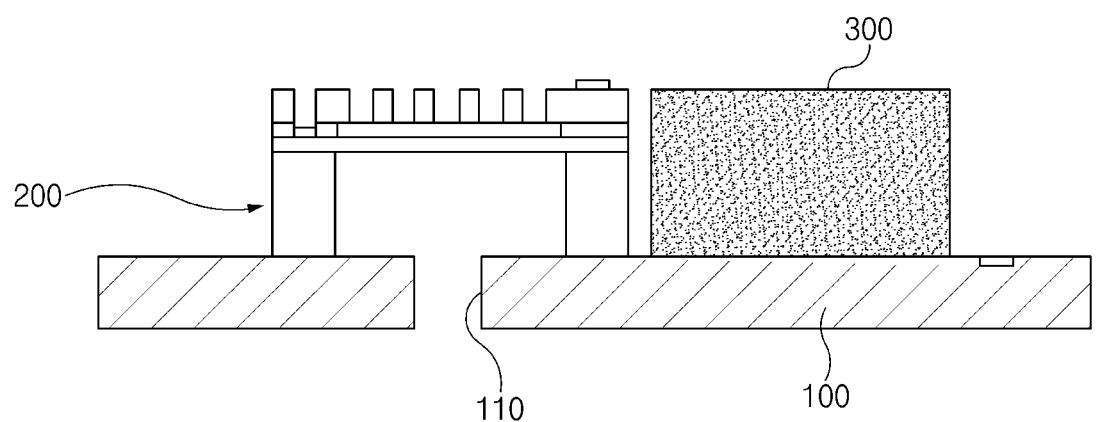
FIGS. 10 to 13 are views illustrating a method of manufacturing the microphone according to an embodiment of the present disclosure.

First, as shown in FIG. 10, the sound-sensing module 200 is mounted on the substrate 100, in which the first sound hole 110 is formed, so as to be aligned with the first sound hole 110.

Figure 11:
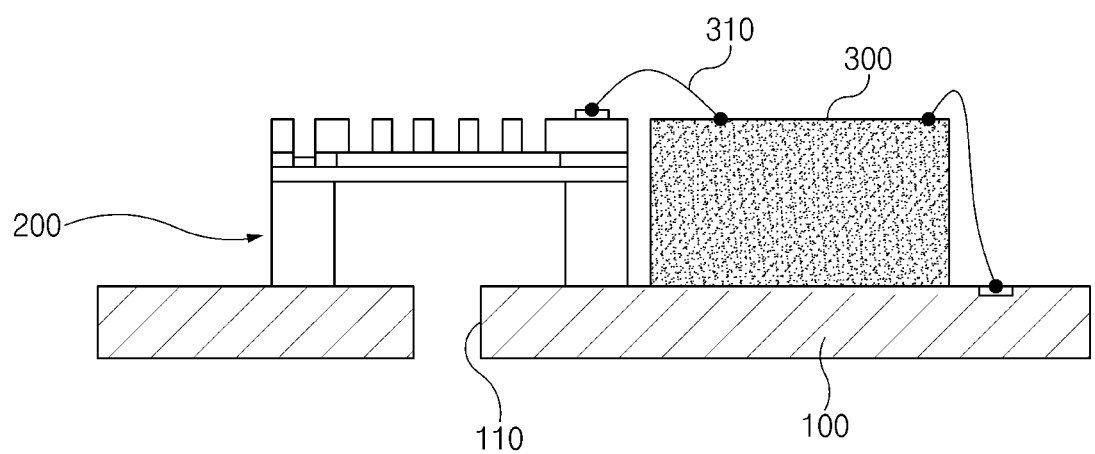

Subsequently, as shown in FIG. 11, the signal-processing chip 300 is mounted on the substrate 100 so as to be electrically connected to the sound-sensing module 200. In one example, the signal-processing chip 300 and the sound-sensing module 200 may be electrically connected to each other via a wire 310.

Figure 12:
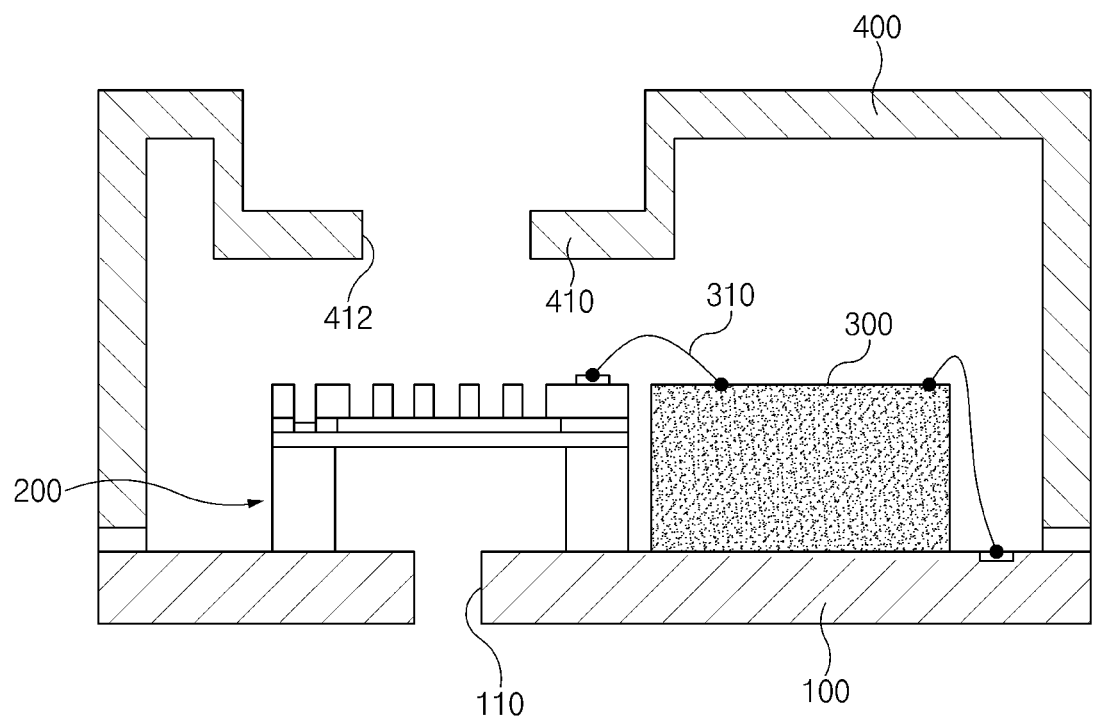

Subsequently, as shown in FIG. 12, the cover 400, which includes the filter accommodation portion 410 having the second sound hole 412 formed therein, is mounted on the substrate 100.

The filter accommodation portion 410 may be formed so as to be recessed in the outer surface of the cover 400.

Figure 13:
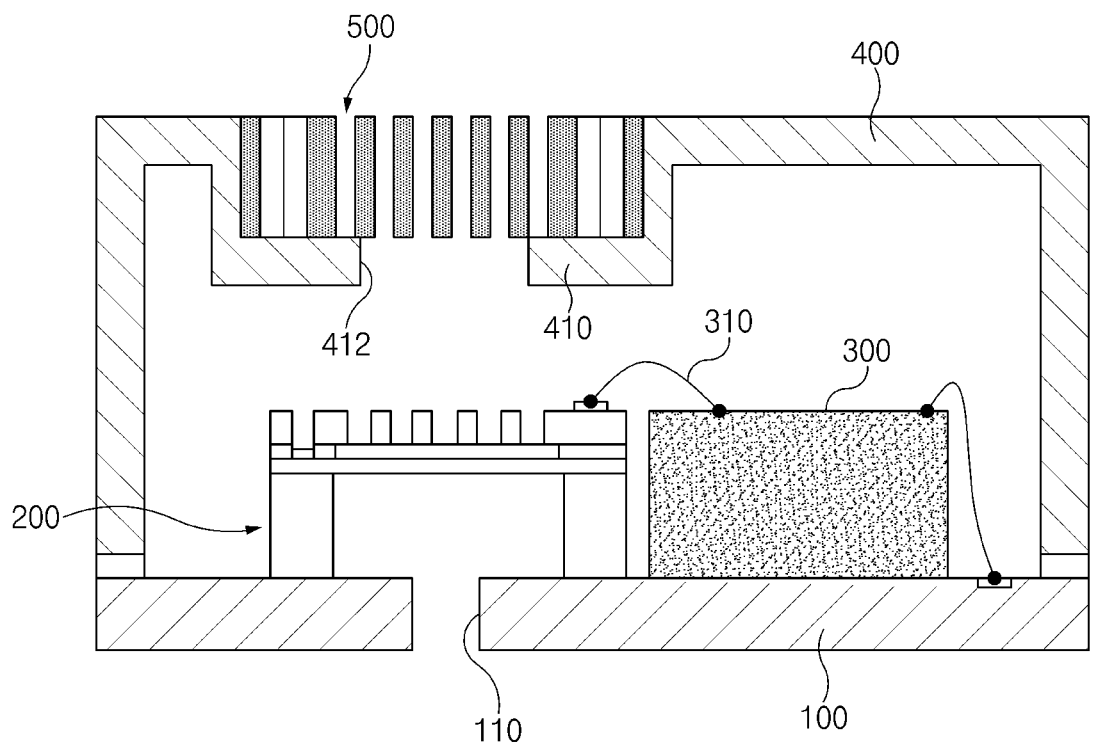

Thereafter, as shown in FIG. 13, the sound delay filter 500 is elastically disposed in the filter accommodation portion 410 so as to be aligned with the second sound hole 412, thereby completing the manufacture of the microphone 10.

In the state in which the sound delay filter 500 is disposed in the filter accommodation portion 410, the sound delay filter 500 does not protrude to the outside of the cover 400, but is disposed inside the cover 400.

The sound delay filter 500 may include a filter substrate 502 having filter holes 502a formed therein, and an elastic pattern 504, which is integrally formed with at least one end portion of the filter substrate 502 and is elastically disposed between the inner wall of the filter accommodation portion 410 and the filter substrate 502.

The elastic pattern 504 may include a contact pattern 504a, which is spaced apart from the end portion of the filter substrate 502 and is in contact with the inner wall of the filter accommodation portion 410, and a spring pattern 504b, which elastically connects the filter substrate 502 to the contact pattern 504a.

In the state in which the sound delay filter 500 is disposed in the filter accommodation portion 410, the arrangement of the sound delay filter 500 may be elastically supported by the elastic force of the spring pattern 504b, which is elastically compressed between the contact pattern 504a and the filter substrate 502.

The sound delay filter 500 may be disposed in the filter accommodation portion 410 after the cover 400 is soldered to the substrate 100.

As such, since the sound delay filter 500 is mounted after the cover 400 is soldered to the substrate 100, it is possible to prevent damage to the sound delay filter 500 and deformation thereof attributable to high-temperature heat generated during the process of soldering the cover 400 to the substrate 100.

In particular, according to the present disclosure, since the sound delay filter 500 is mounted in the cover 400 in a non-bonding manner without using an adhesive, the sound delay filter 500 may be mounted in the cover 400 after the cover 400 is soldered to the substrate 100. Thus, it is possible to minimize the exposure of the sound delay filter 500 to external impacts and interference and to prevent damage to the sound delay filter 500 and deformation thereof attributable to high-temperature heat generated during the process of soldering the cover 400 to the substrate 100.

Further, according to the present disclosure, the material of the sound delay filter 500 may be determined without limitation related to temperature (without limitation due to the heat generated during the soldering process), and thus the sound delay filter 500 may be formed of a polymer material.

The sound delay filter 500 may be manufactured in any of various ways depending on the required conditions and design specifications.

In one example, referring to FIGS. 14 to 17, the sound delay filter 500 may be manufactured by performing a step of forming a sacrificial layer 520 on the upper surface of a base substrate 510, a step of forming a polymer layer 500' on the upper surface of the sacrificial layer 520, a step of patterning the polymer layer 500' to form the filter substrate 502 and the elastic pattern 504, and a step of removing the sacrificial layer 520 from the filter substrate 502 and the elastic pattern 504.

Figure 14:
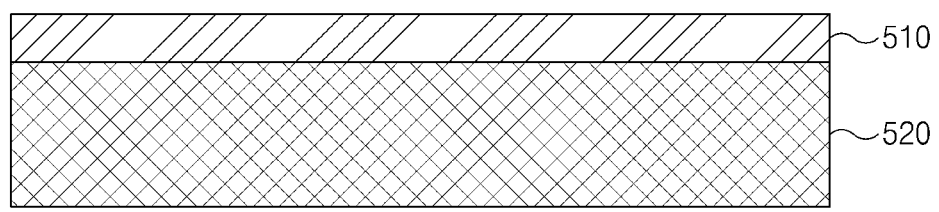
FIGS. 14 to 17 are views illustrating a process of manufacturing the sound delay filter in the method of manufacturing the microphone according to the embodiment of the present disclosure.

First, as shown in FIG. 14, the sacrificial layer 520 (e.g., a photoresist) may be formed on the upper surface of the base substrate 510.

Figure 15:
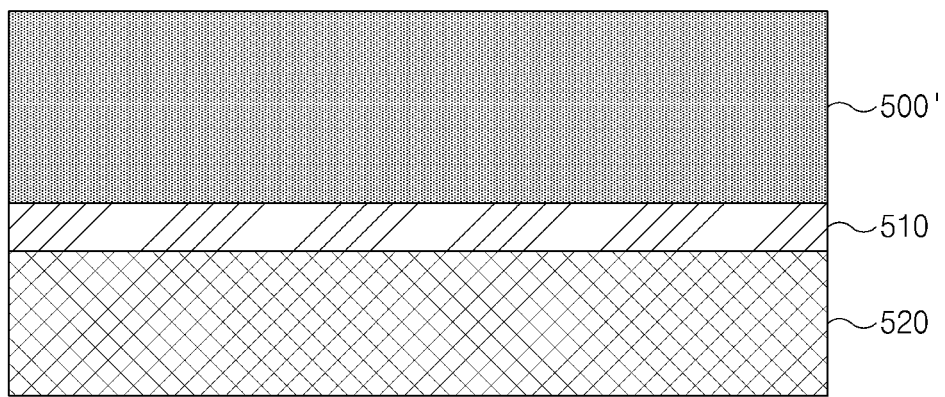
Figure 16:
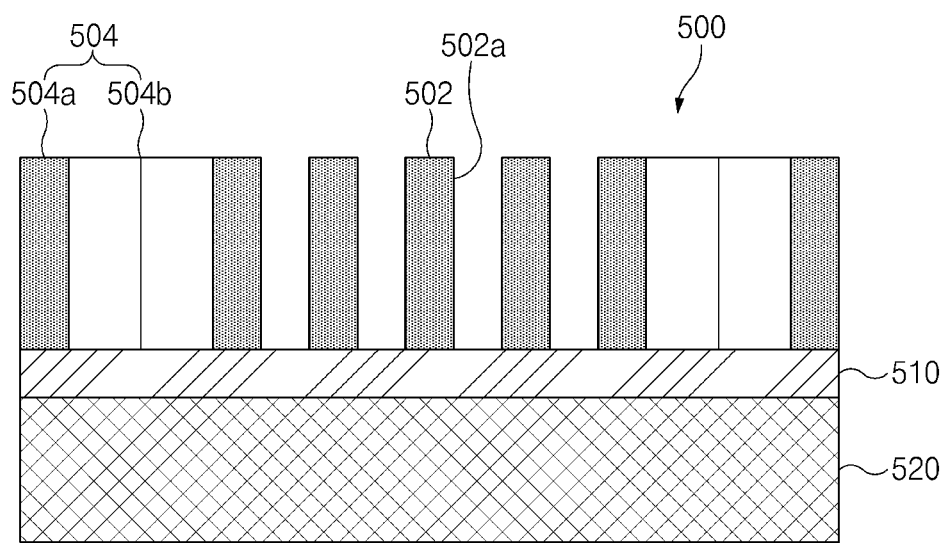

Subsequently, as shown in FIG. 15, the polymer layer 500' (e.g., SU-8) may be formed on the upper surface of the sacrificial layer 520. Subsequently, as shown in FIG. 16, the polymer layer 500' may be patterned to form the filter substrate 502 and the elastic pattern 504.

Figure 17:
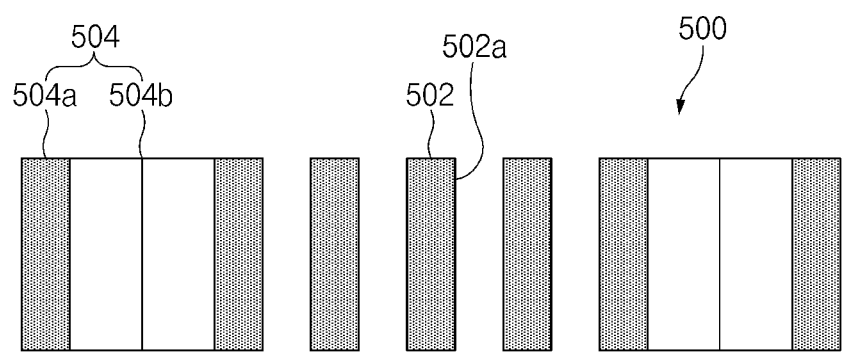

Thereafter, as shown in FIG. 17, the sacrificial layer 520 may be removed from the filter substrate 502 and the elastic pattern 504, thereby completing the manufacture of the sound delay filter 500.

As is apparent from the above description, according to the present disclosure, it is possible to simplify the structure of a microphone and to improve the stability and reliability thereof.

In addition, according to the present disclosure, it is possible to mount a sound delay filter without using an adhesive, thereby preventing performance deterioration and defects attributable to the use of adhesive.

In addition, according to the present disclosure, it is possible to simplify the process of manufacturing a microphone, to reduce the manufacturing costs thereof, and to improve productivity.

In addition, according to the present disclosure, it is possible to improve the durability of a sound delay filter and to increase production yield.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A microphone, comprising:
   a substrate having a first sound hole formed therein;
   a sound-sensing module mounted on the substrate, the sound-sensing module being aligned with the first sound hole;
   a signal-processing chip mounted on the substrate, the signal-processing chip being electrically connected to the sound-sensing module;
   a cover mounted on the substrate, the cover accommodating the sound-sensing module therein, the cover comprising a filter accommodation portion having a second sound hole formed therein; and
   a sound delay filter elastically accommodated in the filter accommodation portion, the sound delay filter being aligned with the second sound hole,
   wherein the sound delay filter comprises:
   a filter substrate having a filter hole formed therein; and
   an elastic pattern integrally formed with at least one end portion of the filter substrate, the elastic pattern being elastically disposed between an inner wall of the filter accommodation portion and the filter substrate.

2. The microphone according to claim 1, wherein the elastic pattern comprises:
   a contact pattern spaced apart from the end portion of the filter substrate, the contact pattern being in contact with the inner wall of the filter accommodation portion; and
   a spring pattern elastically connecting the filter substrate to the contact pattern.

3. The microphone according to claim 2, wherein the elastic pattern is provided symmetrically in a pair at opposite side end portions of the filter substrate in a direction in which the sound delay filter enters the filter accommodation portion.

4. The microphone according to claim 2, wherein the spring pattern is formed in a closed loop shape between the filter substrate and the contact pattern.

5. The microphone according to claim 2, wherein the spring pattern is formed in an open loop shape between the filter substrate and the contact pattern.

6. The microphone according to claim 2, wherein the filter accommodation portion comprises an entry guide configured to guide entry of the sound delay filter thereinto.

7. The microphone according to claim 6, wherein the entry guide comprises an inclined guide surface formed at one end of the filter accommodation portion to guide entry of the sound delay filter into the filter accommodation portion.

8. The microphone according to claim 1, wherein the sound delay filter is formed of a polymer material.

9. The microphone according to claim 1, wherein the filter accommodation portion is formed so as to be recessed in an outer surface of the cover, and wherein the sound delay filter is disposed inside the cover.

10. The microphone according to claim 9, wherein the filter accommodation portion comprises a latching protrusion configured to restrict movement of an outer surface of the sound delay filter.

11. A method of manufacturing a microphone, the method comprising:

mounting a sound-sensing module on a substrate, in which a first sound hole is formed, so as to be aligned with the first sound hole;

mounting a signal-processing chip on the substrate so as to be electrically connected to the sound-sensing module;

mounting a cover comprising a filter accommodation portion having a second sound hole formed therein on the substrate; and elastically disposing a sound delay filter in the filter accommodation portion so as to be aligned with the second sound hole, wherein the sound delay filter comprises:

a filter substrate having a filter hole formed therein; and an elastic pattern integrally formed with at least one end portion of the filter substrate, the elastic pattern being elastically disposed between an inner wall of the filter accommodation portion and the filter substrate.

12. The method according to claim 11, wherein the filter accommodation portion is formed so as to be recessed in an outer surface of the cover, and wherein the sound delay filter is disposed inside the cover.

13. The method according to claim 11, wherein the elastic pattern comprises:

a contact pattern spaced apart from the end portion of the filter substrate, the contact pattern being in contact with the inner wall of the filter accommodation portion; and a spring pattern elastically connecting the filter substrate to the contact pattern.

14. The method according to claim 13, wherein the sound delay filter is manufactured by:

forming a sacrificial layer on an upper surface of a base substrate;

forming a polymer layer on an upper surface of the sacrificial layer;

patterning the polymer layer to form the filter substrate and the elastic pattern; and removing the sacrificial layer from the filter substrate and the elastic pattern.

15. The method according to claim 12, wherein the sound delay filter is disposed in the filter accommodation portion after the cover is soldered to the substrate.

* * * * *